United States Patent
Laker et al.

(10) Patent No.: US 7,538,696 B2
(45) Date of Patent: May 26, 2009

(54) SYSTEM AND METHOD FOR HUFFMAN DECODING WITHIN A COMPRESSION ENGINE

(75) Inventors: Robert William Laker, Fremont, CA (US); David T. Hass, Santa Clara, CA (US)

(73) Assignee: RMI Corporation, Cupertino, CA (US)

( * ) Notice: Subject to any disclaimer, the term of this patent is extended or adjusted under 35 U.S.C. 154(b) by 0 days.

(21) Appl. No.: 11/849,166

(22) Filed: Aug. 31, 2007

(65) Prior Publication Data

US 2009/0058693 A1    Mar. 5, 2009

(51) Int. Cl.
*H03M 7/34* (2006.01)
(52) U.S. Cl. .......................................... 341/51; 341/50
(58) Field of Classification Search ................. 341/50, 341/51, 55, 67, 82; 382/242, 232; 370/469
See application file for complete search history.

(56) References Cited

U.S. PATENT DOCUMENTS

| | | | | |
|---|---|---|---|---|
| 5,406,279 A | * | 4/1995 | Anderson et al. | 341/51 |
| 5,546,477 A | * | 8/1996 | Knowles et al. | 382/242 |
| 5,640,158 A | * | 6/1997 | Okayama et al. | 341/51 |
| 5,970,177 A | | 10/1999 | Chinnock | 382/244 |
| 6,597,812 B1 | * | 7/2003 | Fallon et al. | 382/232 |
| 6,963,586 B2 | * | 11/2005 | Henriksson et al. | 370/469 |
| 2001/0054131 A1 | | 12/2001 | Alvarez et al. | 711/105 |
| 2007/0109153 A1 | * | 5/2007 | Ma et al. | 341/50 |

OTHER PUBLICATIONS

International Search Report and Written Opinion from PCT Application No. PCT/US08/08107 mailed on Jan. 30, 2009.

* cited by examiner

*Primary Examiner*—Jean B Jeanglaude
(74) *Attorney, Agent, or Firm*—Zilka-Kotab, PC

(57) ABSTRACT

An apparatus to implement Huffman decoding in an INFLATE process in a compression engine. An embodiment of the apparatus includes a bit buffer, a set of comparators, and a lookup table. The bit buffer stores a portion of a compressed data stream. The set of comparators compares the portion of the compressed data stream with a plurality of predetermined values. The lookup table stores a plurality of LZ77 code segments and outputs one of the LZ77 code segments corresponding to an index at least partially derived from a comparison result from the set of comparators.

27 Claims, 6 Drawing Sheets

SYSTEM AND METHOD FOR HUFFMAN DECODING WITHIN A COMPRESSION ENGINE

BACKGROUND

Huffman coding is an encoding algorithm for lossless data compression. Huffman coding uses a variable length code table for encoding a source symbol such as a character in a file. In general, the variable-length code table is derived from the number of occurrences of each source symbol in the file.

Conventional Huffman coding is used as a part of the GNU zip (gzip) DEFLATE and INFLATE processes, as specified in RFC 1951. FIG. 1 illustrates a conventional compression application 10 which uses the DEFLATE and INFLATE processes to transform between a file 12 and a compressed file 14. In particular, the DEFLATE process converts the file 12 into a compressed file 14. The INFLATE process is an inverse process used to decompress the compressed file 14 to recreate the original file 12. In the DEFLATE process, files 12 are first compressed using LZ77, and then the resulting LZ77 code is Huffman coded to provide an even better compression performance. The INFLATE process implements Huffman decoding to recover the LZ77 code, and then decompresses the LZ77 code to recreate the files 12.

In conventional implementations of the INFLATE process, a series of lookups are implemented using the variable-length Huffman code values to find the LZ77 code values used in a subsequent decoding operation. These longest-prefix look up operations are typically implemented in software using an associative array. Other conventional hardware implementations use a ternary content-addressable memory (CAM) structure. However, associative arrays and ternary CAMs have certain disadvantages. For example, ternary CAMs are relatively large so they consume a significant amount of circuit area.

SUMMARY

Embodiments of a method are described. In one embodiment, the method is a method for Huffman decoding within a compression engine. An embodiment of the method includes receiving a compressed data stream. The method also includes comparing a portion of the compressed data stream with a plurality of predetermined values using a plurality of comparators. The method also includes outputting a LZ77 code value based on the portion of the compressed data stream and a comparison result from comparing the portion of the compressed data stream with the plurality of predetermined values. Other embodiments of the method are also described.

Embodiments of an apparatus are also described. In one embodiment, the apparatus is an apparatus to implement Huffman decoding in an INFLATE process in a compression engine. An embodiment of the apparatus includes a bit buffer, a set of comparators, and a lookup table. The bit buffer stores a portion of a compressed data stream. The set of comparators compares the portion of the compressed data stream with a plurality of predetermined values. The lookup table stores a plurality of LZ77 code segments and outputs one of the LZ77 code segments corresponding to an index at least partially derived from a comparison result from the set of comparators. Other embodiments of the apparatus are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

In the following description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

While many embodiments are described herein, at least some of the described embodiments implement logic to facilitate all or part of an INFLATE process to decompress a compressed file. More specifically, at least one embodiment uses a set of comparators to determine a code length of an incoming code and an adder (or other addition logic) to determine an index into a lookup table (LUT) that is based on a random access memory (RAM). As a result, some embodiments of the Huffman logic are faster than a ternary CAM and consume less circuit area.

Additionally, some embodiments may be used with dynamic and/or static Huffman coding, as explained in more detail below. For a static Huffman code, fewer comparators (e.g., 2 comparators) may be used to determine a code length, and the LUT is programmed during initialization. In contrast, for a dynamic Huffman code, a preamble sequence provides the code length of each of the codes. The number of codes of each length are then tabulated and used to determine the starting code for each code length. A RAM index is derived by subtracting the starting code and adding the number of all shorter codes, which may be pre-computed to allow a single addition operation. Thus, the codes may be stored in a contiguous manner within the RAM-based LUT.

As one example, the largest lookup value may be for a 286-entry literal/length code. This LZ77 would have 9 code bits together with associated extra data size, which can vary from 0 to 5 bits, depending on the code. This extra data size is stored alongside the LZ77 code word, so the total size of the RAM LUT for this exemplary code is 286 locations each of 12 bits—9 bits for the code and 3 bits for the extra data size.

Figure 2:
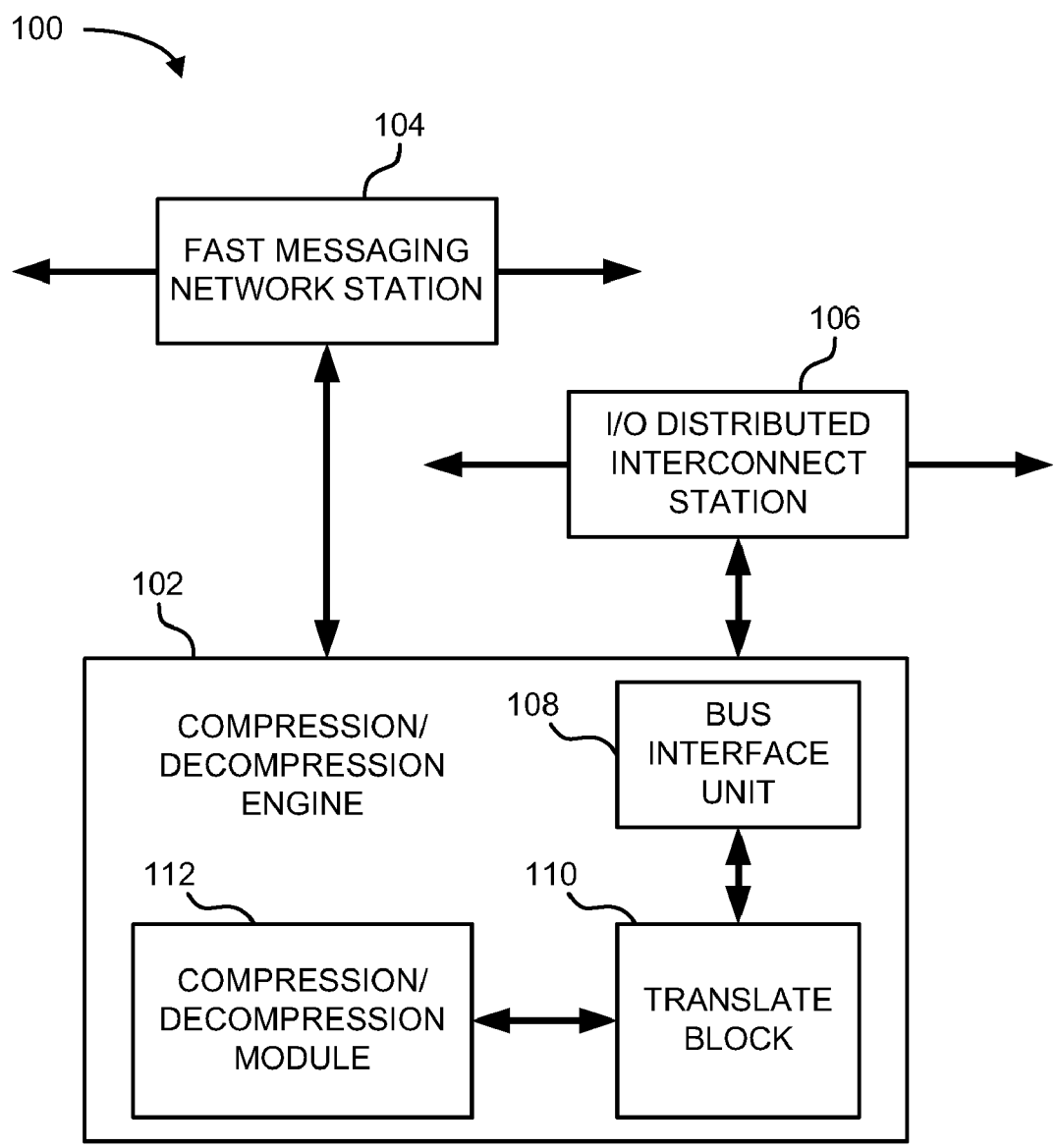
FIG. 2 depicts a schematic block diagram of one embodiment of a computing environment.

FIG. 2 depicts a schematic block diagram of one embodiment of a computing environment 100. The illustrated computing environment 100 includes a compression/decompression engine (CDE) 102, a fast messaging network (FMN) station 104, and an input-output (I/O) distributed interconnect station 106. An exemplary embodiment of the CDE 102 is described in more detail below.

In one embodiment, the I/O distributed interconnect station 106 is part of a high speed distributed interconnect ring which connects multiple cores, caches, and processing agents. The high speed distributed interconnect ring supports simultaneous transactions among the connected components.

The FMN 104 provides a channel for messages directed to and from the CDE 102. In some embodiments, the messages may direct the CDE 102 to perform compression or indicate completion of a compression operation.

Figure 4:
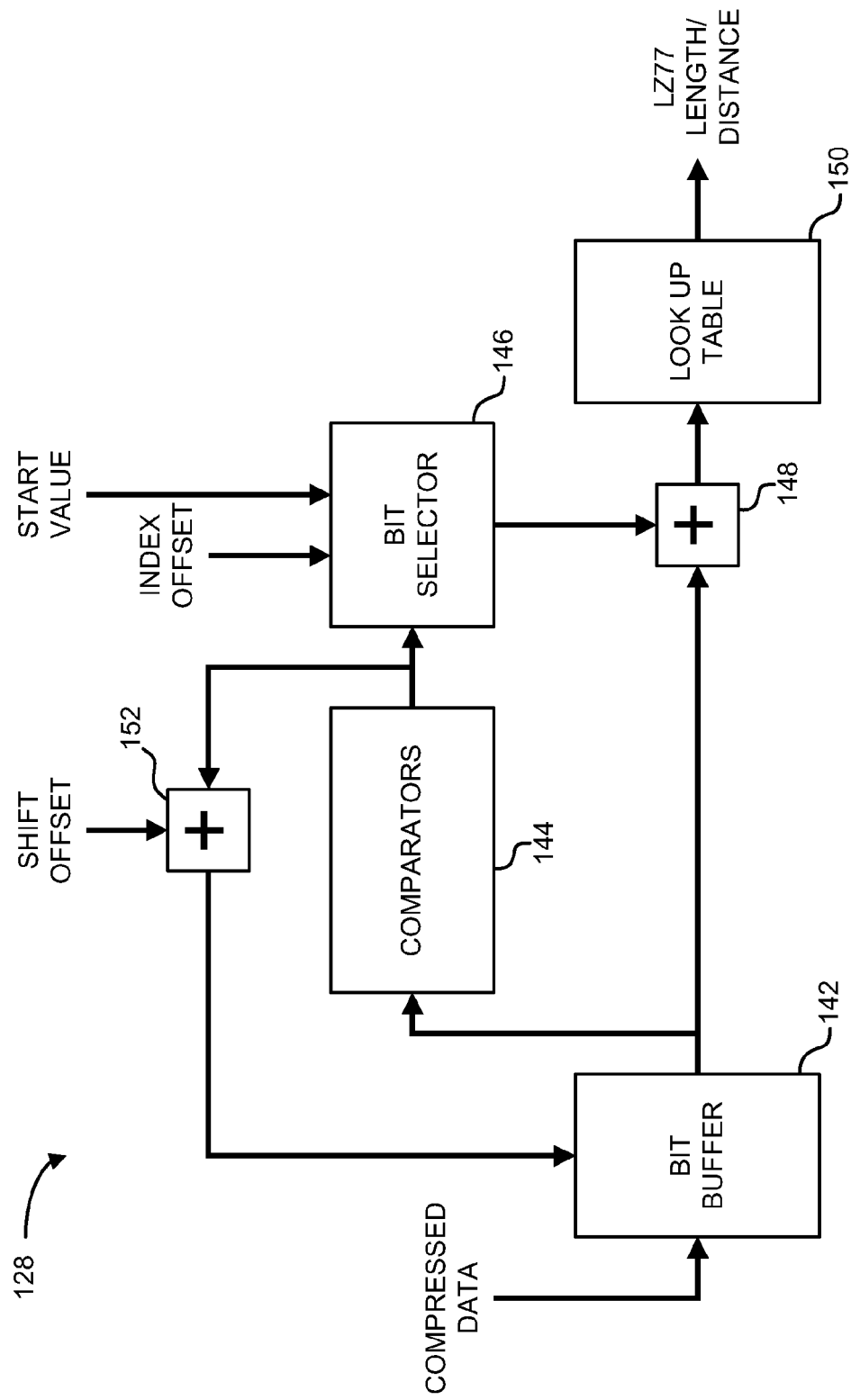
FIG. 4 depicts a schematic block diagram of one embodiment of a hardware implementation of the Huffman logic of the INFLATE pipeline of the compression/decompression module shown in FIG. 3.

In general, the CDE 102 is configured to compress files for transfer via the BIU 108 and to decompress compressed files received via the BIU 108. Alternatively, other embodiments of the CDE 102 may be implemented in other computing environments in which compressed files may be used. The illustrated CDE 102 includes a bus interface unit (BIU) 108, a translate block (XLT) 110, and a compression/decompression module (CDM) 112. The BIU 108 provides a data interface to the I/O distributed interconnect station 106 and the I/O distributed interconnect ring. The XLT 110 provides an interface between the BIU 108 and the CDM 112. In one embodiment, the XLT 110 uses its own direct memory access (DMA) engine to read and write data via the BIU 108, so the XLT 110 may operate autonomously from a central procession unit (CPU) coupled to the computing environment 100. The CDM 112 performs compression and decompression operations for the CDE 102. A more detailed embodiment of the CDM is shown in FIG. 4 and described below. Other embodiments of the CDE 102 may include fewer or more components. Additionally, other embodiments of the CDE 102 may implement more or less functionality than is described herein.

Figure 3:
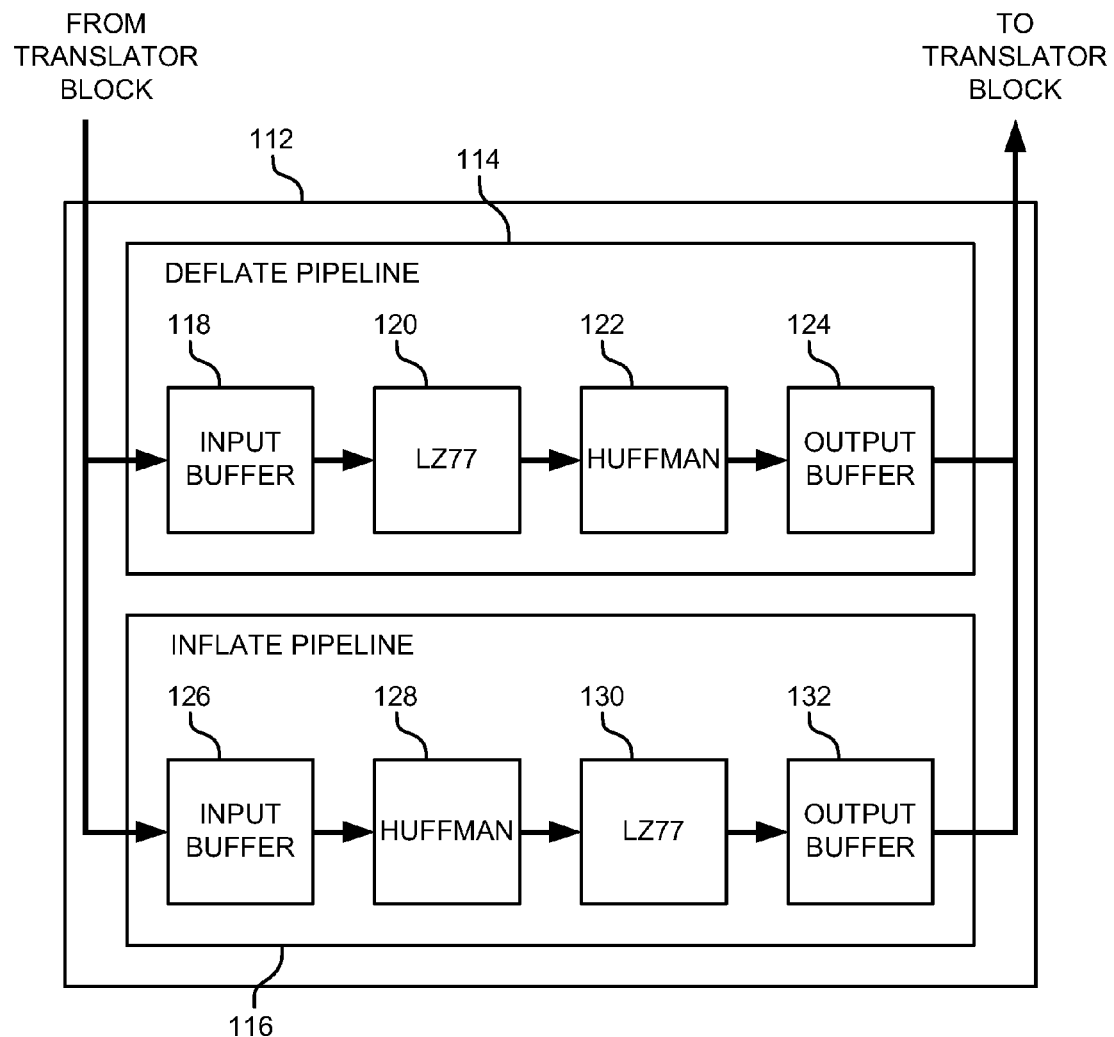
FIG. 3 depicts a schematic block diagram of a more detailed embodiment of the compression/decompression module shown in FIG. 2.

FIG. 3 depicts a schematic block diagram of a more detailed embodiment of the compression/decompression module (CDM) 112 shown in FIG. 2. The illustrated CDM 112 includes a DEFLATE pipeline 114 and an INFLATE pipeline 116. The DEFLATE pipeline 114 is available to implement the CDE compression process, also referred to as the DEFLATE process. The illustrated DEFLATE pipeline 114 includes an input buffer 118, LZ77 logic 120, Huffman logic 122, and an output buffer 124. The INFLATE pipeline 116 is available to implement the CDE decompression process, also referred to as the INFLATE process. The illustrated INFLATE pipeline 116 includes an input buffer 126, Huffman logic 128, LZ77 logic 130, and an output buffer 132. Although each pipeline is shown with individual schematic components, at least some of the components may operate in conjunction with both pipelines 114 and 116 using a single implementation. Other embodiments of the CDM 112 may incorporate fewer or more components.

Figure 1:
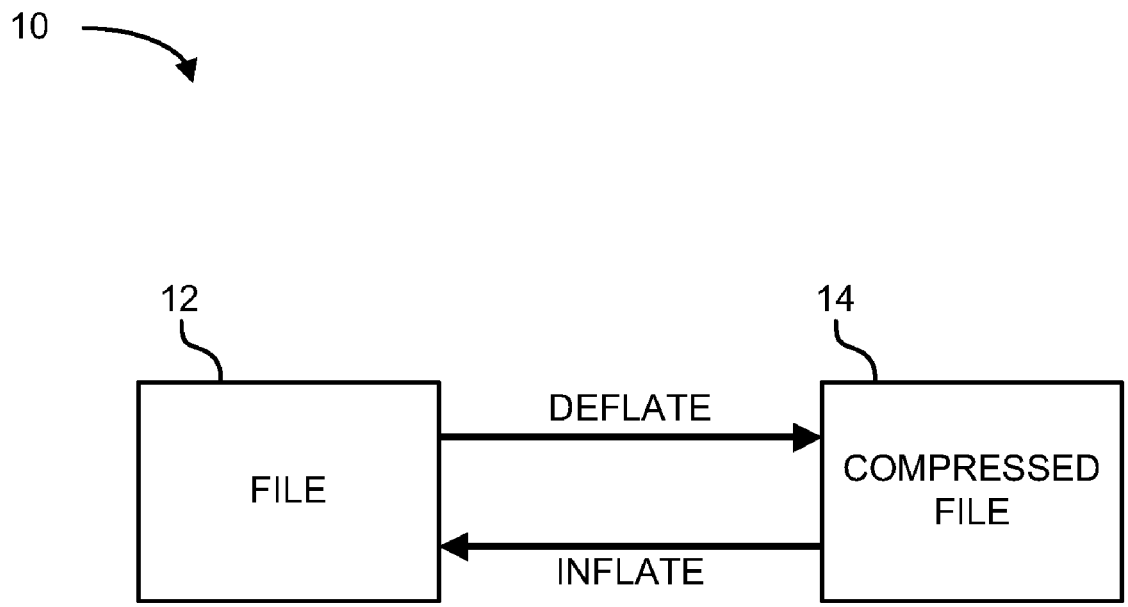
FIG. 1 illustrates a conventional compression application which uses the DEFLATE and INFLATE processes to transform between a file and a compressed file.

For both the DEFLATE pipeline 114 and the INFLATE pipeline 116, the CDM supports various operating modes, including static compression, dynamic compression, and no compression. A file such as the file 12 of FIG. 1 may be split into blocks, and each block may use any of the three modes. Hence, the various blocks of a single file may be compressed using any combination of these three modes.

For the DEFLATE process, splitting the file into blocks is performed as a pre-process before the file is presented to the CDE 102. The CDE 102 then compresses each block and uses bit-stitching to recombine the compressed blocks in the deflated bit stream. For the INFLATE process, the deflated bit stream is input to the CDE 102 and the CDE decompresses the blocks individually, according to the block header information within the bit stream.

The DEFLATE and INFLATE processes use two algorithms to achieve compression. The LZ77 algorithm, implemented by the LZ77 logic 120 for the DEFLATE process, creates a dictionary of strings of bytes that have occurred previously in the file. In one embodiment, the LZ77 logic 120 enforces a minimum string length (e.g., three bytes) for the byte strings in the dictionary. The LZ77 logic 120 then replaces strings with a distance value (e.g., up to 32,768 bytes) and a length value (e.g., up to 258 bytes) for a matching string. If no match exists, then the incoming byte is output as a literal character.

Subsequently, the Huffman logic 122 (for the DEFLATE process) implements the Huffman algorithm to replace the literal, length, and distance codes with codes whose length depends on the frequency of occurrence of the LZ77 codes in the block. More specifically, the Huffman logic 122 implements one of three coding modes: static compression, dynamic compression, and no compression. For static compression, a predefined code is used which is not necessarily ideal for the block being coded, but still typically achieves good compression. Static compression coding may be executed relatively quickly. Dynamic compression coding, in contrast, may be slower since it uses two passes—one pass to create a statistics table of the frequency of occurrence of each LZ77 code and to generate an optimized Huffman code, and a second pass to make use of the Huffman code to encode the LZ77 data. Although dynamic coding may be slower than static coding in some instances, it also may result in a higher compression ratio. Regardless of whether dynamic or static compression is implemented, the Huffman logic 122 outputs a serial bit stream which is sent a byte at a time to the XLT 110. In some embodiments, the bit stream is packed with zeroes at the end of the file in order to finish on a byte boundary. As one example, the maximum transfer rate is approximately 3.2 Gbps at 400 MHz, although other levels of performance may be achieved using other systems.

In a more detailed embodiment of the static compression mode, the Huffman logic 122 parses the LZ77 compressed data, replacing symbols with equivalent Huffman codes and extra length and distance bits. More specifically, a static LUT is built upon initialization, and the LUT is used to provide a Huffman code for every literal, length, or distance subsequently presented to it. In some embodiments, there are 30 distance codes, each having 5 bits. Additionally, literal and length codes may be part of the same 286-entry LUT (refer to FIG. 4) or part of a separate LUT (refer to FIG. 5). In some embodiments, each literal and length code is 7, 8, or 9 bits in size. Furthermore, many of the length and distance codes may have extra data which follows directly after the code word, which provides a range of possible lengths or distances. The extra bits are also used to define an exact length or distance. However, the number of extra bits is a function of the code, with longer codes having more extra data values. The Huffman logic 122 then outputs the deflated block, including the compressed data and other symbols.

In a more detailed embodiment of the dynamic compression mode, the Huffman logic 122 implements multiple phases. In one embodiment, two phases are implemented for dynamic Huffman coding. In the first phase (also referred to as the first pass), the Huffman logic 122 gathers statistics for each of 286 literal/length codes. The Huffman logic 122 also gathers statistics for each of 30 distance codes. In the second phase (also referred to as the second pass), several operations are implemented. In one embodiment, a literal and length heap is built, and a literal and length Huffman tree is built. Then the literal and length Huffman code is generated. Similar heap, tree and code generation operations are also implemented for the corresponding distance value and the bit length. Subsequently, the Huffman logic 122 outputs the bit length code sizes, the literal/length codes using the bit length code, and the distance code using the bit length code. In one embodiment, the Huffman logic 122 parses the literal/length and distance Huffman codes, replacing code lengths and repetition counts with equivalent bit length Huffman codes. Similarly, the Huffman logic 122 may parse the LZ77 compressed data, replacing symbols with equivalent Huffman codes and extra length and distance bits. The output literal/length codes and distance codes are also referred to as the output bit stream.

It should also be noted that some input files, or data such as embedded image data within a file, may already be in a compressed format. As a result, the static and dynamic coding techniques of the Huffman logic 122 may be unable to compress such data further, or potentially may increase the size of the compressed data. For these types of input files, the Huffman logic 122 may implement a format without further compression (i.e., the "no compression mode"). In this mode, the data are split into blocks, with each block being up to 65,535 bytes in size. The compression process also adds a header for this data type and then outputs the data stream as is.

In general, the INFLATE process is the reverse of the DEFLATE process. Although some aspect of the INFLATE process are less complicated than the DEFLATE process (e.g., there is no need to choose a decoding or decompression mode), other complications may arise in the INFLATE process. For example, some embodiments of the INFLATE process are configured to process any valid compressed file, including the possibility of unlimited block size, as well as distances and lengths up to the maximums specified in the industry standards.

Within the INLATE process, the Huffman logic 128 receives data from the XLT 110 via the input buffer 126. In some embodiments, the Huffman logic 128 operates in a single phase, regardless of whether the data are statically or dynamically encoded. For static decoding, the LUT is programmed during initialization. A set of comparators is used to determine the length of each incoming literal/length code, which may be for example 7, 8, or 9 bits. In some embodiments, the distance codes are all 5 bits in length. However, other embodiments may use different bit lengths for the literal/length and distance codes. An offset is then added to the code to put it into the correct range within the LUT. The output of the LUT provides both the value of the code and the length of any extra data that is appended.

In contrast to the LUT for the static decoding, the dynamic LUT is programmed on demand. In some embodiments, the Huffman logic 128 reads and stores the size (e.g., 1-7 bits) of each bit length code and determines the sum of codes of each size for the bit length codes. The Huffman logic 128 also determines the start code for each code size for the bit length codes. The Huffman logic 128 then writes the bit length LUT.

Using the bit length LUT, the Huffman logic 128 reads and stores the size (e.g., 1-15 bits) of each literal/length code and determines the sum codes of each size for the literal/length codes. The Huffman logic 128 also determines the start code for each code size for the literal/length codes. The Huffman logic 128 then writes the literal/length LUT.

The Huffman logic 128 also uses the bit length LUT to read and store the size (e.g., 1-15) bits of each distance code and to determine the sum of codes of each size for the distance codes. The Huffman logic 128 also determines the start code for each code size of the distance codes. The Huffman logic 128 then writes the distance LUT.

Like the static LUT, a set of comparators is used to determine the size of each incoming literal/length and distance code. In one embodiment, 14 comparators are used because the size may vary from 1 to 15 bits. Other embodiments may use other quantities of comparators. The output of the LUT gives both the value of the code and the length of any extra data that is appended. Together the code and extra data are used to recover the length or distance value. In some embodiments, literals are treated like lengths but have no extra data. In this way, the original LZ77 sequence is recovered and output to the LZ77 logic 130 of the INFLATE pipeline 116. The LZ77 logic 130 then reconstructs the original file data and sends the original file data via the output buffer 132 to the XLT 110.

FIG. 4 depicts a schematic block diagram of one embodiment of a hardware implementation of the Huffman logic 128 of the INFLATE pipeline 116 of the compression/decompression module (CDM) 112 shown in FIG. 3. In general, the Huffman logic 128 receives compressed data from the XLT 110 and generates LZ77 length and distance code values to send to the LZ77 logic 130. The illustrated Huffman logic 128 includes a bit buffer 142, a set of comparators 144, a bit selector 146, a shift adder 148, an index adder 150, and a LUT 152. Other embodiments of the Huffman logic 128 may include fewer or more components or may implement more or less functionality.

In one embodiment, the bit buffer 142 receives the compressed data from the XLT 110. For example, the bit buffer 142 may receive the compressed data via the input buffer 126 of the INFLATE pipeline 116. Additionally, in some embodiments the compressed data in the bit buffer 142 does not include header information which is previously stripped and processed separately. The bit buffer 142 stores multiple bits (e.g., at least 15 bits) of the compressed data prior to sending the bits to the comparators 144 and the index adder 148. In some embodiments, the bit buffer 142 may write the bits (e.g., 4 bytes at a time) to a scratch buffer (not shown) before the bits are sent to the comparators 144 and/or the index adder 148.

The set of comparators 144 compares the buffered bits to a plurality of different preloaded values. For example, some embodiments use 14 different preloaded values, although other embodiments may use fewer or more values and corresponding comparators. As an example, a dynamic code may include a total of 10 codes of length 4, 16 codes of length 6, and 16 codes of length 7. The shortest codes are numbered first, starting from 0, so they are codes 0000 thru 1001. The start code for the next code length is derived by multiplying the next code (1010) by 2 (for length 5 codes) and by 2 again to give a length 6 code. Hence, the starting code for the codes of length 6 is 101000. So the length 6 codes are numbered 101000 thru 110111. Using a similar technique, the length 7 codes start at 1110000 and are numbered 1110000 thru 1111111. The decimal equivalents for these code ranges are 0 thru 9 for the length 4 codes, 40 thru 55 for the length 6 codes, and 112 thru 127 for the length 7 codes. In the lookup table these are stored in indices 0 thru 41 because there are 42 codes. The length 4 codes are easy, the start code is 0 and the number of shorter codes is 0, so the index offset is 0. The length 6 codes have a start code of 40 and 10 shorter codes, so an offset of 30 is subtracted to get the index for the length 6 codes. The length 7 codes have a start of 112 and 26 shorter codes, so an offset of 86 is subtracted to get the index for the length 7 codes. Using these values, the 14 comparators 144 would be set thus 2>=0, 3>=0, 4>=0, 5>=40, 6>=40, 7>=112, 8>=0×8000, 15>=0×8000. The largest triggered comparator 144 gives the code length. It should also be noted that codes with lengths greater than the longest code in use are compared with a 16-bit value so that they are not triggered.

The result of the comparison provides a bit selection value that is input to the bit selector 146, which selects one or more values to add to the value of the bits in the bit buffer 142. In one embodiment, the bit selector 146 selects an index offset to add to the bits in the bit buffer 142. In another embodiment, the bit selector 146 selects a start value to add to the bits in the bit buffer 142. It should also be noted that multiple parameters may be selected, either independently or as a pre-computed sum value, to be added to the bits in the bit buffer 142. As an example, the bit selector may select 1 of 15 pre-computed values using a bit selection value between 1 and 15 (e.g., using a 4-bit value). Other embodiments may use a different number of possible values. The index adder 148 then adds the selected values to the bits in the bit buffer 142. In some embodiments, the bit selector 146 and the index adder 148 may be combined into a single functional block.

The resulting index from the index adder 148 is then used to look up corresponding LZ77 length or distance code values in the LUT 150. Where a single LUT 150 is used for the length and distance values, the LZ77 length and distance code values are output in an alternating manner. It should also be noted that the LUT 150 may be used to look up literal values in a manner substantially similar to the length values. In one embodiment, the LUT 150 is a 286×9 RAM, and the output LZ77 code value is a 9-bit code. In another embodiment, the LUT 150 is a 286×13 RAM in order to accommodate a 9-but code value and 4 bits of extra data size. In another embodiment, the LUT 150 is a 320×9 or 320×13 RAM to combine the length and distance code values in the LUT 150.

In one embodiment, the bit selection value from the set of comparators 144 is also sent to the shift adder 152 to add a shift offset to the bit selection value. In one embodiment, the shift offset is the extra data size from the LUT 150, which is described above. Hence, the shift adder 152 adds the extra data size to the code length from the comparators 144 to get the total shift amount to read the next code in the data stream. In this way, the result of the shift addition is then used to indicate the next variable-length Huffman code in the bit buffer 142. In some embodiments, shifting the location of the bit buffer 142 avoids one or more extra bits that are not needed for the lookup operations.

Figure 5:
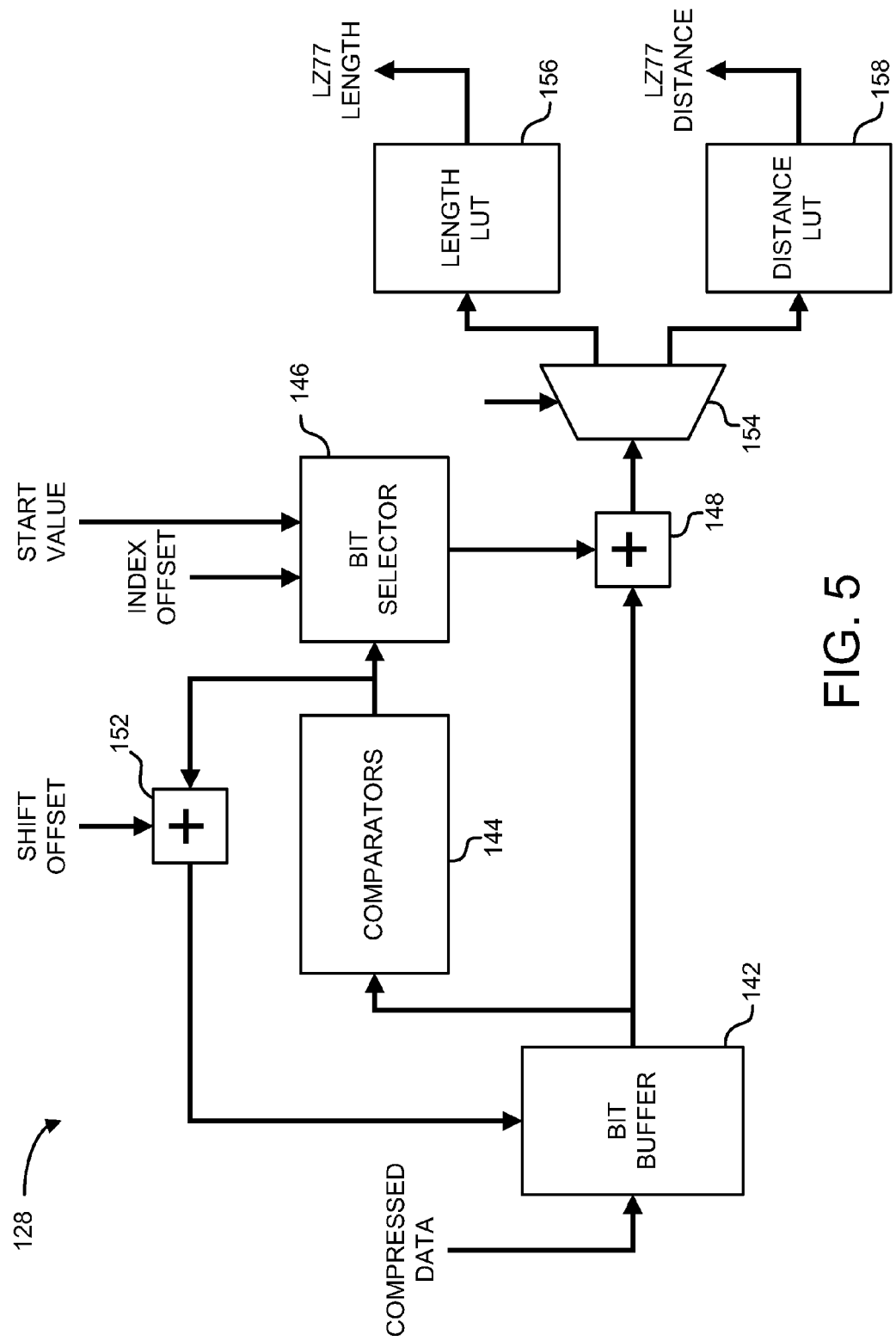
FIG. 5 depicts a schematic block diagram of another embodiment of a hardware implementation of the Huffman logic of the INFLATE pipeline of the compression/decompression module shown in FIG. 3.

FIG. 5 depicts a schematic block diagram of another embodiment of a hardware implementation of the Huffman logic 128 of the INFLATE pipeline 116 of the compression/decompression module (CDM) 112 shown in FIG. 3. In many aspects, the Huffman logic 128 shown in FIG. 5 is substantially similar to the Huffman logic 128 shown in FIG. 4. However, the Huffman logic 128 of FIG. 5 includes a demultiplexor 154 and uses multiple LUTs 156 and 158 to look up the LZ77 length and distance code values, instead of using a single, combined LUT 150.

In one embodiment, the demultiplexor 154 receives the index from the index adder 148 and directs the index to either a length LUT 156 or a distance LUT 158, depending on a control signal. In one embodiment, the demultiplexor 154 alternates sending the index to the length LUT 156 and the distance LUT 158. Thus, one index value is used to look up the LZ77 length (or literal) code value in the length LUT 156, and the next index value is used to look up the corresponding LZ77 distance code value. Other embodiments may implement other combinations of demultiplexors 156 and LUTs 150, 156, and 158.

Figure 6:
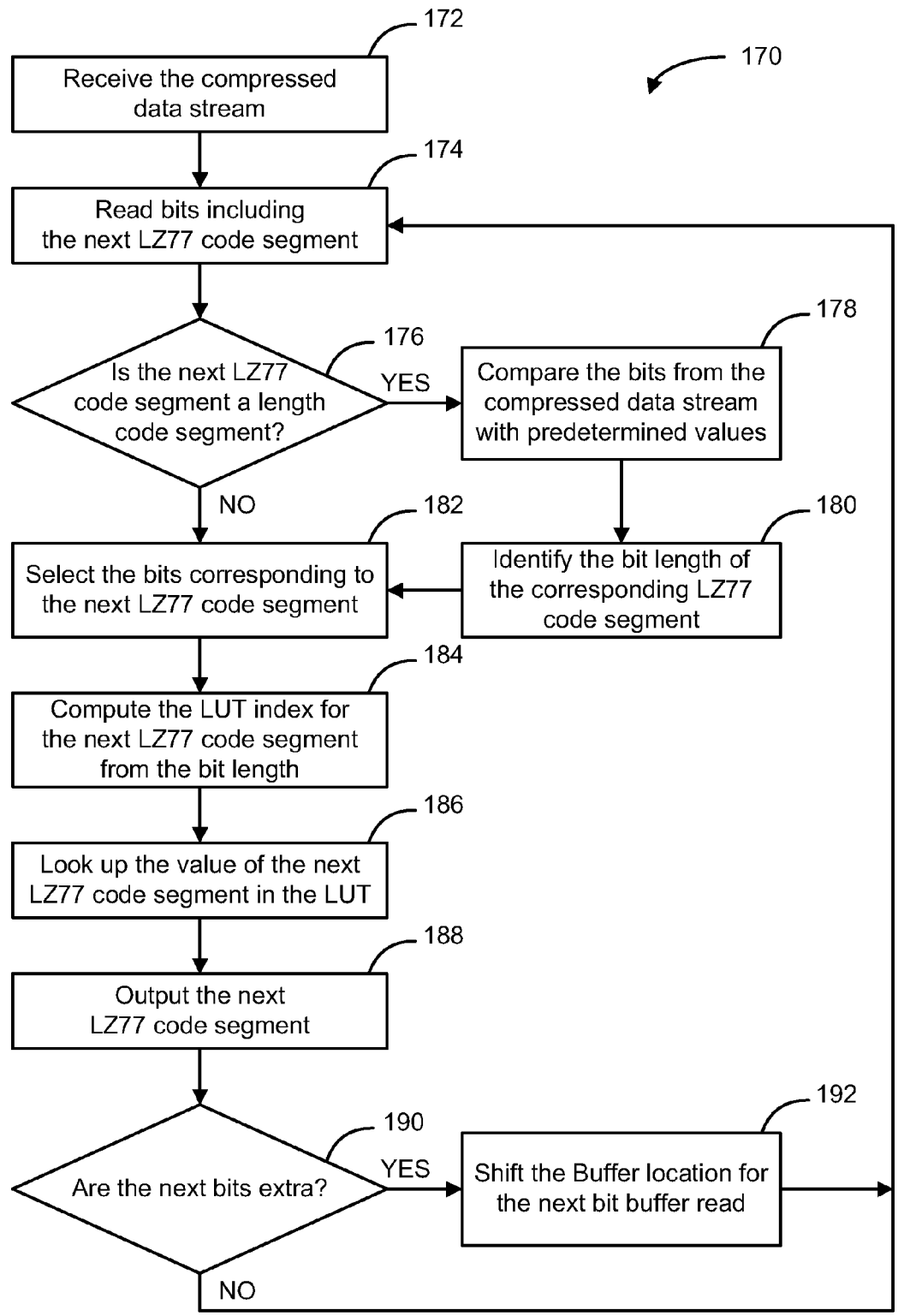
FIG. 6 depicts a schematic flow chart diagram of one embodiment of a Huffman decoding method that may be implemented in conjunction with the Huffman logic of the INFLATE pipeline of the compression/decompression engine shown in FIG. 3.

FIG. 6 depicts a schematic flowchart diagram of one embodiment of a Huffman decoding method 170 that may be implemented in conjunction with the Huffman logic 128 of the INFLATE pipeline of the compression/decompression engine (CDE) 102 shown in FIG. 2. Although the Huffman decoding method 170 is described with reference to the CDE 102 of FIG. 2, other embodiments may be implemented in conjunction with other compression/decompression engines. Also, it should be noted that at least some of the operations of the illustrated Huffman decoding method 170 may be implemented in parallel (e.g., interleaved) or in another order.

In the illustrated Huffman decoding method 170, the Huffman logic 128 receives 172 the compressed data stream and the buffer 142 reads 174 a number of bits from the variable-length bit stream. In one embodiment, the Huffman logic 128 then determines 176 if the next LZ77 code segment is a length code segment. If so, then the comparators 144 compare 178 the bits from the bit buffer 142 with a plurality of predetermined values. In this way, the comparators 144 identify 180 the bit length of the corresponding LZ77 code segment.

After identifying the bit length of the corresponding LZ77 code segment, or after determining that the next LZ77 code segment is not a length code segment, then the bit selector 146 selects 182 values corresponding to the LZ77 code segment and computes 184 the LUT index for the next LZ77 code segment. The index is then used to look up 186 the value of the corresponding LZ77 code segment in the LUT 150, which outputs 188 the LZ77 code segment to for processing by the LZ77 logic 130. Additionally, the shift adder 152 determines 190 if the next bits are extra bits and, if so, shifts 192 the buffer location for the next bit buffer read operation. The illustrated Huffman decoding method 170 then ends.

It should be noted that embodiments of the methods, operations, functions, and/or logic may be implemented in software, firmware, hardware, or some combination thereof. Additionally, some embodiments of the methods, operations, functions, and/or logic may be implemented using a hardware or software representation of one or more algorithms related to the operations described above. To the degree that an embodiment may be implemented in software, the methods, operations, functions, and/or logic are stored on a computer-readable medium and accessible by a computer processor.

Embodiments of the invention also may involve a number of functions to be performed by a computer processor such as a central processing unit (CPU), a graphics processing unit (GPU), or a microprocessor. The microprocessor may be a specialized or dedicated microprocessor that is configured to perform particular tasks by executing machine-readable software code that defines the particular tasks. The microprocessor also may be configured to operate and communicate with other devices such as direct memory access modules, memory storage devices, Internet related hardware, and other devices that relate to the transmission of data. The software code may be configured using software formats such as Java, C++, XML (Extensible Mark-up Language) and other languages that may be used to define functions that relate to operations of devices required to carry out the functional operations related described herein. The code may be written in different forms and styles, many of which are known to those skilled in the art. Different code formats, code configurations, styles and forms of software programs and other means of configuring code to define the operations of a microprocessor may be implemented.

Within the different types of computers, such as computer servers, that utilize the invention, there exist different types of memory devices for storing and retrieving information while performing some or all of the functions described herein. In some embodiments, the memory/storage device where data is stored may be a separate device that is external to the processor, or may be configured in a monolithic device, where the memory or storage device is located on the same integrated circuit, such as components connected on a single substrate. Cache memory devices are often included in computers for use by the CPU or GPU as a convenient storage location for information that is frequently stored and retrieved. Similarly, a persistent memory is also frequently used with such computers for maintaining information that is frequently retrieved by a central processing unit, but that is not often altered within the persistent memory, unlike the cache memory. Main memory is also usually included for storing and retrieving larger amounts of information such as data and software applications configured to perform certain functions when executed by the central processing unit. These memory devices may be configured as random access memory (RAM), static random access memory (SRAM), dynamic random access memory (DRAM), flash memory, and other memory storage devices that may be accessed by a central processing unit to store and retrieve information. Embodiments may be implemented with various memory and storage devices, as well as any commonly used protocol for storing and retrieving information to and from these memory devices respectively.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for Huffman decoding within a compression engine, the method comprising:
   receiving a compressed data stream;
   comparing a portion of the compressed data stream with a plurality of predetermined values using a plurality of comparators;
   outputting a LZ77 code value based on the portion of the compressed data stream and a comparison result from comparing the portion of the compressed data stream with the plurality of predetermined values; and
   generating a bit selection value based on the comparison of the portion of the compressed data stream with the plurality of the predetermined values; and
   generating an index based on the portion of the compressed data stream and the bit selection value.

2. The method according to claim 1, wherein the LZ77 code value comprises a LZ77 length code segment.

3. The method according to claim 1, wherein the LZ77 code value comprises a LZ77 distance code segment.

4. The method according to claim 1, wherein the LZ77 code value comprises a literal value.

5. The method according to claim 1, further comprising adding a start value to the portion of the compressed data stream to generate the index.

6. The method according to claim 1, further comprising adding an index offset to the portion of the compressed data stream to generate the index.

7. The method according to claim 1, further comprising adding a pre-computed value to the portion of compressed data stream to generate the index.

8. The method according to claim 7, wherein the pre-computed value comprises a start value and an index offset.

9. The method according to claim 1, further comprising looking up the LZ77 code value in a lookup table based on the index.

10. The method according to claim 9, further comprising:
    looking up a first LZ77 code value in a first lookup table based on the index; and
    looking up a second LZ77 code value in a second lookup table based on a subsequent value of the index.

11. An apparatus to implement Huffman decoding in an INFLATE process in a compression engine, the apparatus comprising:
    a bit buffer to store a portion of a compressed data stream;
    a set of comparators coupled to the bit buffer, the set of comparators to compare the portion of the compressed data stream with a plurality of predetermined values;
    a lookup table coupled to the set of comparators, the lookup table to store a plurality of LZ77 code segments and to output one of the LZ77 code segments corresponding to an index at least partially derived from a comparison result from the set of comparators; and
    a bit selector coupled to the set of comparators, the bit selector to receive the comparison result and to identify a value to be added to the portion of the compressed data stream.

12. The apparatus according to claim 11, wherein the lookup table comprises a single combined lookup table comprising both LZ77 length code segments and LZ77 distance code segments.

13. The apparatus according to claim 11, wherein the LZ77 code value comprises a LZ77 length code segment.

14. The apparatus according to claim 11, wherein the LZ77 code value comprises a LZ77 distance code segment.

15. The apparatus according to claim 11, wherein the LZ77 code value comprises a literal value.

16. The apparatus according to claim 11, further comprising an index adder to add the value to the portion of the compressed data stream according to the bit selector.

17. The apparatus according to claim 11, wherein the value to be added to the portion of the compressed data stream comprises an index offset minus a start value.

18. The apparatus according to claim 11, wherein the value to be added to the portion of the compressed data stream comprises a pre-computed value comprising a start value and an index offset.

19. The apparatus according to claim 11, further comprising an index adder to add the value to the portion of the compressed data stream according to the bit selector.

20. The apparatus according to claim 11, wherein the lookup table comprises a plurality of LZ77 length code segments, the apparatus further comprising a second lookup table coupled to the bit buffer, the second lookup table comprising a plurality of LZ77 distance code segments.

21. The apparatus according to claim 20 further comprising a demultiplexor coupled between an index adder and the lookup tables, the demultiplexor to direct the index value to one of the lookup tables.

22. An apparatus to implement Huffman decoding in an INFLATE process in a compression engine, the apparatus comprising:

means for receiving a compressed data stream;

means for comparing a portion of the compressed data stream with a plurality of predetermined values using a plurality of comparators;

means for outputting a LZ77 code value based on the portion of the compressed data stream and a comparison result from comparing the portion of the compressed data stream with the plurality of predetermined values; and means for generating a bit selection value based on the comparison of the portion of the compressed data stream with the plurality of the predetermined values.

23. The apparatus according to claim 22, further comprising means for generating an index based on portion of the compressed data stream and the bit selection value.

24. The apparatus according to claim 23, further comprising means for adding an index value minus a start value to the portion of the compressed data stream to generate the index.

25. The apparatus according to claim 23, further comprising:

means for pre-computing a sum value of a least a start value and an index offset; and means for adding the pre-computed value to the portion of the compressed data stream to generate the index.

26. The apparatus according to claim 22, further comprising means for looking up the LZ77 code value in a lookup table based on the index.

27. The apparatus according to claim 22, further comprising:

means for looking up a first LZ77 code value in a first lookup table based on the index; and means for looking up a second LZ77 code value in a second lookup table based on a subsequent value of the index.

* * * * *

UNITED STATES PATENT AND TRADEMARK OFFICE
CERTIFICATE OF CORRECTION

PATENT NO.        : 7,538,696 B2                                    Page 1 of 1
APPLICATION NO.   : 11/849166
DATED             : May 26, 2009
INVENTOR(S)       : Laker et al.

It is certified that error appears in the above-identified patent and that said Letters Patent is hereby corrected as shown below:

In the claims:
col. 10, lines 53-55 replace "further comprising" to and through "according to the bit selector." with --wherein the lookup table comprises a random access memory (RAM) lookup table (LUT).--.

In the Specification:
col. 1, line 30 replace "look up" with --lookup--.`
col. 5, line 30 replace "aspect" with --aspects--.
col. 6, lines 27-28 replace "a shift adder 148, an index adder 150, and a LUT 152." with --a shift adder 152, an index adder 148, and a LUT150.--.
col. 7, line 33 replace "9-but" with --9-bit--.

Signed and Sealed this

Twenty-sixth Day of January, 2010

David J. Kappos
*Director of the United States Patent and Trademark Office*